(12) United States Patent
Griffin et al.

(10) Patent No.: US 7,994,869 B2
(45) Date of Patent: Aug. 9, 2011

(54) CURRENT-CONTROLLED HYSTERETIC OSCILLATOR

(75) Inventors: Jed Griffin, Peyton, CO (US); Miguel Gamarra, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 88 days.

(21) Appl. No.: 12/430,760

(22) Filed: Apr. 27, 2009

(65) Prior Publication Data

US 2010/0271143 A1    Oct. 28, 2010

(51) Int. Cl.
H03K 3/2897    (2006.01)

(52) U.S. Cl. ........................ 331/143; 331/111

(58) Field of Classification Search ............ 331/111, 331/113 R, 143, 144
See application file for complete search history.

(56) References Cited

U.S. PATENT DOCUMENTS

| 5,617,062 | A | * | 4/1997 | O'Shaughnessy et al. ... 331/111 |
| 5,668,508 | A | * | 9/1997 | Pulvirenti et al. ............ 331/111 |

* cited by examiner

*Primary Examiner* — Robert Pascal
*Assistant Examiner* — James E Goodley
(74) *Attorney, Agent, or Firm* — Fish & Richardson P.C.

(57) ABSTRACT

The disclosed current-controlled hysteretic oscillator operates by controlled currents opposing each other in differential pairs to set a controlled hysteresis for improved relaxation oscillations with immunity to phase or frequency error.

5 Claims, 4 Drawing Sheets

CURRENT-CONTROLLED HYSTERETIC OSCILLATOR

TECHNICAL FIELD

This subject matter is generally related to clocking and analog circuits.

BACKGROUND

Conventional oscillators and voltage controlled oscillators (VCOs) used in integrated circuit (IC) designs are susceptible to phase or frequency error and are limited in frequency range due to instability across a wide bandwidth. Commonly used ring oscillators are notoriously susceptible to phase or frequency error, altering the resonant frequency proportional to any phase error induced in the loop. Phase error can come from a number of sources, but a dominant source is noise on voltage supplies causing jitter and hence phase error on circuit elements in the loop.

Conventional approaches to deal with phase noise have been orientated toward controlling noise sources rather than designing oscillators to be more immune to such noise. One exception are oscillators that use higher-order filters to lock in frequency independent of phase error. But such conventional oscillators are expensive to implement, requiring more accurate discrete components, which is not amenable to IC design. Also, tuning to a tight band may not be useful in applications requiring wide frequency ranges, such as VCOs or oscillators requiring tuning across frequency.

SUMMARY

The disclosed current-controlled hysteretic oscillator operates by controlled currents opposing each other in differential pairs to set a controlled hysteresis for improved relaxation oscillations with immunity to phase or frequency error. The immunity to phase or frequency error allows tight locking to a desired frequency and an increase in stability across a wide range of frequencies. In some implementations, the disclosed oscillator provides about a 50% duty cycle across a wide range of frequencies.

DETAILED DESCRIPTION

Figure 1:
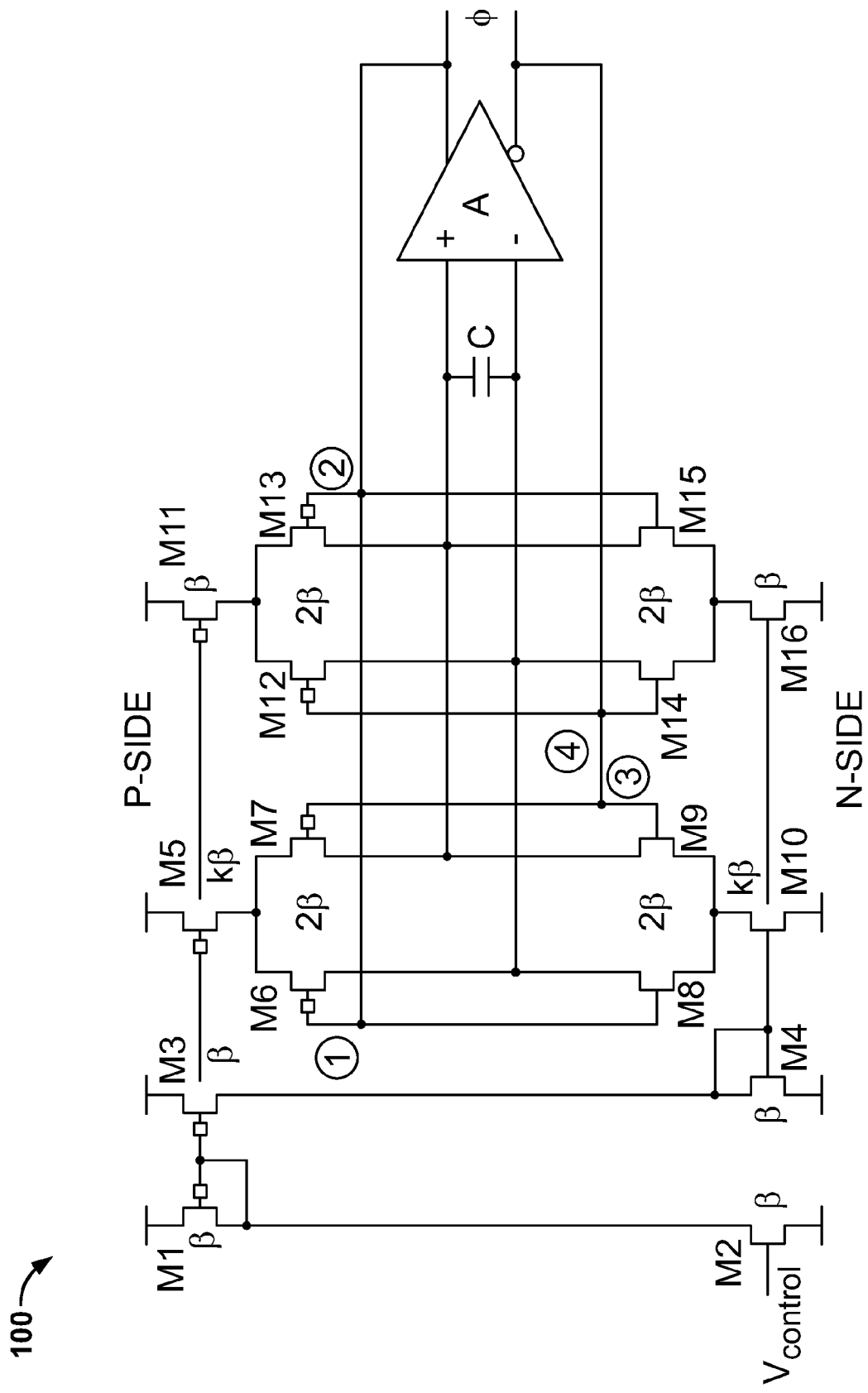
FIG. 1 is a block diagram of an example current-controlled hysteretic oscillator.

FIG. 1 is a block diagram of an example current-controlled hysteretic oscillator 100. A control voltage $V_{control}$ at the gate (or base if bipolar) of transistor M2 sets the frequency of the oscillator 100. The transistors M1, M3, form a first current mirror for mirroring current from M2 to transistors M5, M11 (e.g., PMOS transistors) in the upper portion of the oscillator 100 (hereinafter referred to as the "P" side), and the transistors M3, M4 form a second current mirror for mirroring current from M2 to transistors M10, M16 (e.g., NMOS transistors) in the lower portion of the oscillator 100 (hereinafter referred to "N" side).

On the "P" side, a first branch of the oscillator 100 includes transistors M5, M6, M7, M8, M9, M10. Transistors M6 and M7 form a first differential pair. Current into the first differential pair is scaled by $\kappa\beta$ contributed by transistor M5. The sizing of transistor M5 is relative to $\beta$, set by the W/L ratio of M5, where W is channel width, L is channel length, and $\kappa$ is a scalar less than 1 (e.g., 0.5 or 0.2) that defines the amount of hysteresis in the oscillator 100. For example, a small value of $\kappa$ provides less hysteresis than a large value of $\kappa$.

On the "N" side, transistors M8 and M9 form a second differential pair. Current into the second differential pair is scaled by $\kappa\beta$ contributed by transistor M10.

On the "P" side, a second branch of the oscillator 100 includes transistors M11, M12, M13, M14, M15, M16. Transistors M12 and M13 form a third differential pair. Current into the third differential pair is scaled by $\beta$ contributed by transistor M11. The sizing of transistor M11 is relative to $\beta$, set by the W/L ratio of transistor M1.

On the "N" side, transistors M14 and M15 form a fourth differential pair. Current into the fourth differential pair is scaled by $\beta$ contributed by transistor M16. Thus, the current into the third and fourth differential pairs is greater than the current into the first and second differential pairs due to the factor $\kappa$ which is less than 1.

An operational amplifier A has a capacitor C across its positive and negative inputs. In some implementations, the capacitor C operates as a 1-pole filter. The size of $V_{control}$, $\beta$, $\kappa$, and C determine the frequency operation, $\phi$, where $\phi \sim (1-\kappa)(V_{control}-V_T)^2 A_d \beta/(2V_{swing}C)$, circuit constant $A_d$ is the differential gain of amplifier A, $V_{swing}$ is the magnitude of output signal swing, and $V_T$ is the threshold voltage of the transistors.

The positive output of the amplifier A is coupled to node 2 and the negative output of amplifier A is coupled to node 4. This effectively attaches a current sink (current to ground) to the non-inverting input to A (+A) and a current source (current from supply voltage) to inverting input to A (−A) when positive output is high and negative output is low. Conversely, a current source connects to the non-inverting input to A (+A) and a current sink to the inverting input to A (−A) when positive output is low and negative output is high. Both the current source and the current sink have equal magnitude and form the negative feedback currents to incite oscillation.

The positive output of the amplifier A is coupled to node 1 and the negative output of amplifier A is coupled to node 3. This effectively attaches a current sink to the non-inverting input to A (+A) and a current source to inverting input to A (−A) when positive output is low and negative output is high. Conversely, a current source connects to the non-inverting input to A (+A) and a current sink to the inverting input to A (−A) when positive output is high and negative output is low. Both the current source and the current sink have equal magnitude and are a factor $\kappa$ less than and opposite polarity to the negative feedback currents, thus forming hysteresis in conjunction with negative feedback currents. In this example configuration, the lesser hysteretic currents in the first branch will contend with the main feedback currents in the second branch oscillating in amplitudes relative to the amplifier A outputs.

Figure 2:
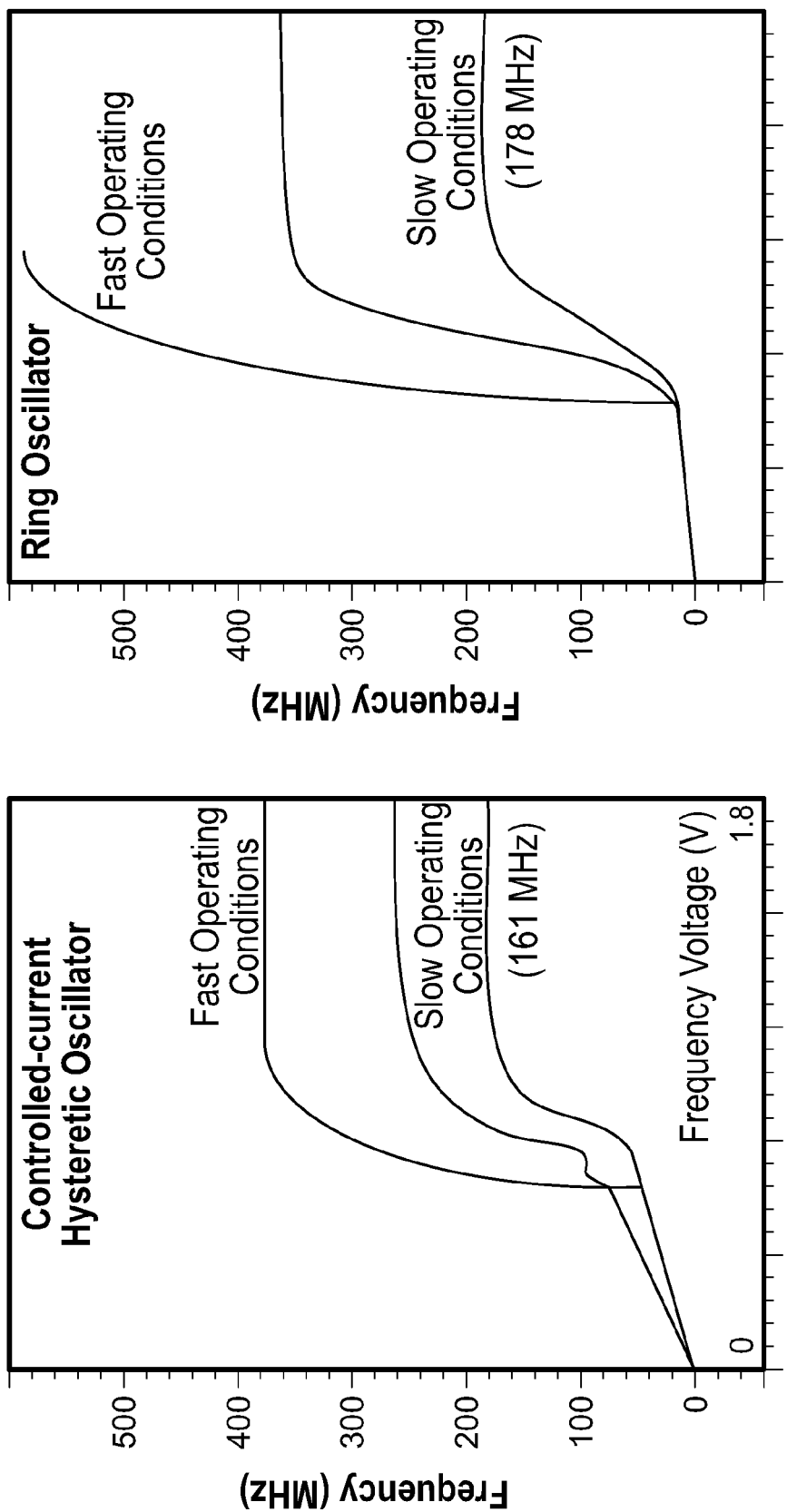
FIG. 2 are plots of relative frequency range and stability for the circuit of FIG. 1

FIG. 2 are plots of relative frequency range and stability for the circuit of FIG. 1 and a conventional ring oscillator. The y-axis of the plots is frequency (MHz) and the x-axis of the plots is frequency voltage (Volts). In attempting to match frequency range, the greater instability inherent in ring oscillators is evident (e.g., a complete breakdown at fast conditions), and the duty cycle varies widely across frequency in contrast to the greater stability and constant 50% duty cycle inherent in the oscillator 100.

Figure 3:
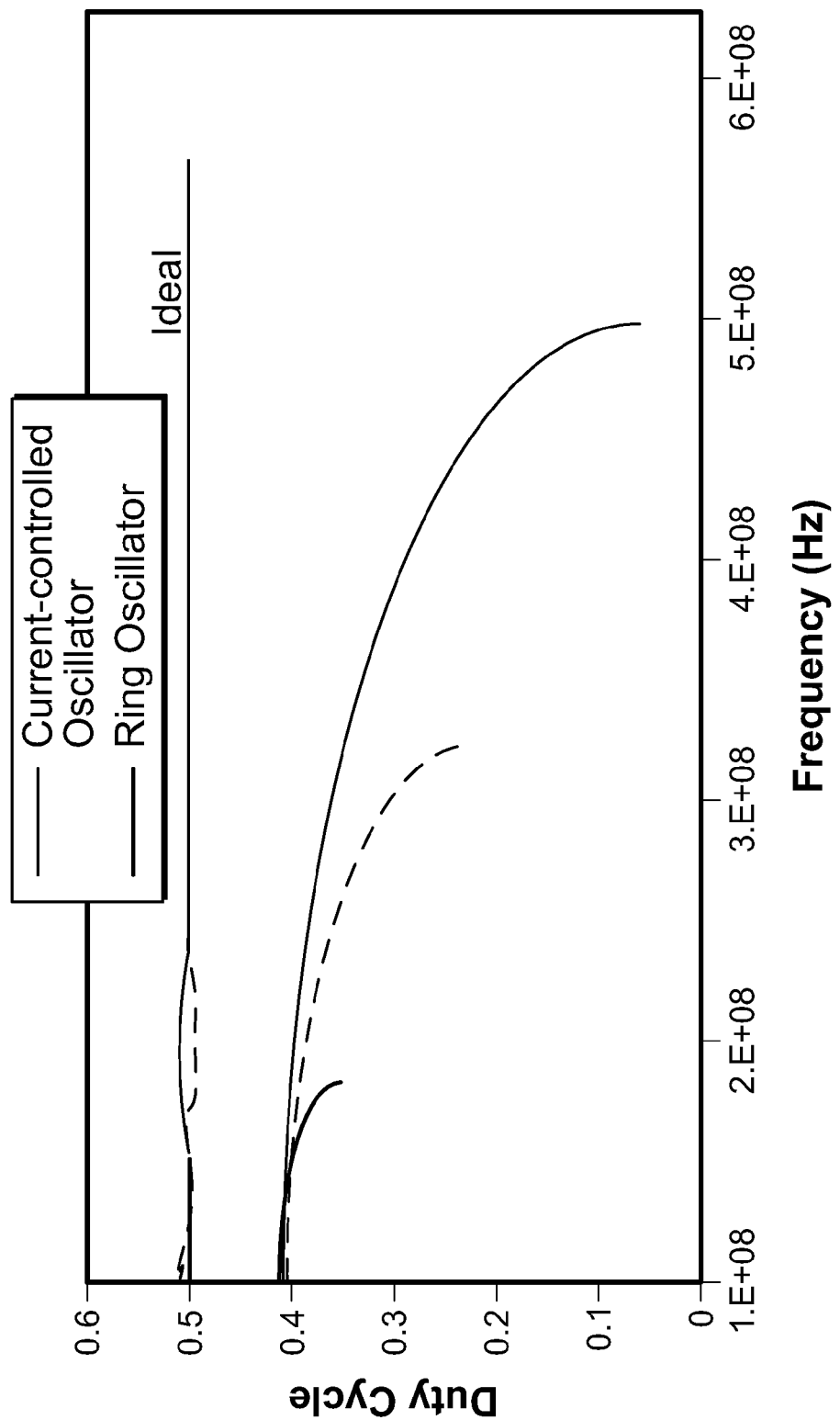
FIG. 3 are plots of duty cycle across frequency and operating conditions for the circuit of FIG. 1.

FIG. 3 are plots of duty cycle across frequency and operating conditions for the circuit of FIG. 1 and a conventional ring oscillator. The bold lines represent fast operating conditions and the thin lines represent slow operating conditions. Dashed lines represent nominal. In contrast to the oscillator 100, the ring oscillator displays the characteristic unwieldiness with duty cycle across frequency.

Figure 4:
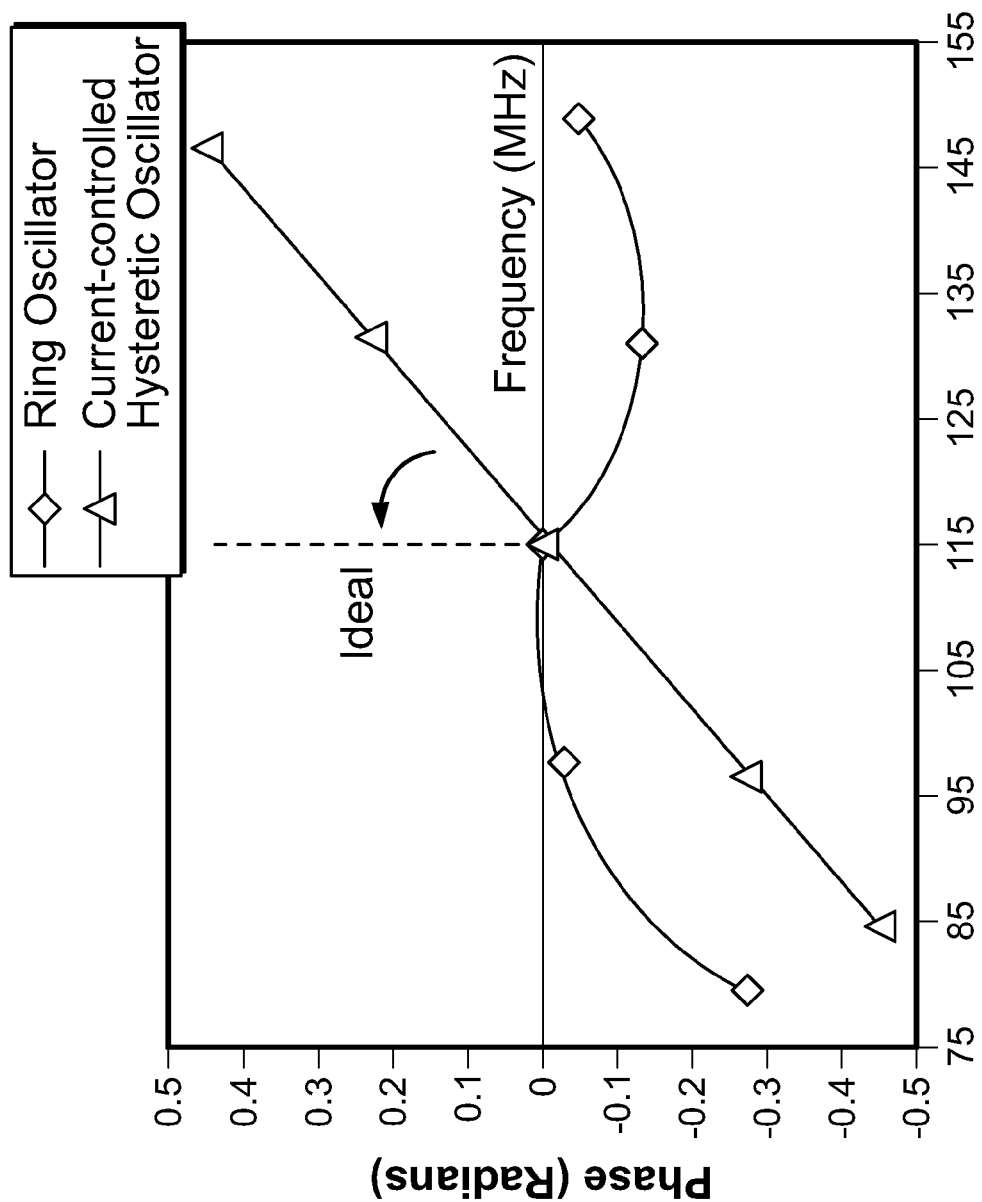
FIG. 4 are plots of phase to frequency relative to ideal for the circuit of FIG. 1.

FIG. 4 are plots of phase to frequency relative to ideal for the circuit of FIG. 1. A key advantage of the oscillator 100 is shown in FIG. 4. By better controlling phase via hysteresis (note linearity), and tightly controlled current, the nearer ideal performance of the oscillator 100 relative to the ring oscillator is discernable. The filters used on both oscillators are the most common and least expensive first-order low pass filters. By using n-order filters (where n is an integer greater than 1), the oscillator 100 can be improved, ideally approaching an impulse function as a band pass filter. However, given the first-order, low pass filters commonly used in IC oscillators, the oscillator 100 allows more ideal oscillator performance by controlling phase through hysteresis using the unique mirroring of currents to achieve the hysteresis, as described in reference to FIG. 1.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An oscillator circuit, comprising:
    an amplifier having positive and negative inputs and positive and negative outputs;
    a filter coupled to the positive and negative inputs of the amplifier;
    a first side of the oscillator circuit including:
    a first differential pair including a positive side transistor and a negative side transistor, the positive side transistor coupled to the positive output of the amplifier, the negative side transistor coupled the negative output of the amplifier;
    a first current control transistor coupled to an input of the first differential pair and operable for controlling current input into the first differential pair, where the current is controlled by scaling the current by a product of $\kappa\beta$, where $\beta$ is a gain factor of the first current control transistor and $\kappa$ is scalar less than one for controlling hysteresis of the oscillator circuit;
    a second differential pair coupled to the first differential pair and including a positive side transistor and negative side transistor, the positive side transistor coupled to the negative output of the amplifier, the negative side transistor coupled to the positive output of the amplifier;
    a second side of the oscillator circuit including:
    a third differential pair including a positive side transistor and a negative side transistor, the positive side transistor coupled to the positive output of the amplifier, the negative side transistor coupled the negative output of the amplifier;
    a second current control transistor coupled to the third differential pair and operable for controlling current input into the third differential pair, where the current is controlled by scaling the current by a product of $\kappa\beta$, where $\beta$ is a gain factor of the second current control transistor and $\kappa$ is scalar less than one for controlling hysteresis of the oscillator circuit; and
    a fourth differential pair coupled to the third differential pair and including a positive side transistor and negative side transistor, the positive side transistor coupled to the negative output of the amplifier, the negative side transistor coupled to the positive output of the amplifier.

2. The circuit of claim 1, further comprising:
    a current mirror coupled to a voltage control, $V_{control}$, and to the first current control transistor and the second current control transistor, the current mirror operable for providing current to the differential pairs.

3. The circuit of claim 1, where the first side of the oscillator circuit includes PMOS transistors and the second side of the oscillator circuit includes NMOS transistors.

4. The circuit of claim 1, where the filter is a n-order filter, and n is an integer greater or equal to 1.

5. The circuit of claim 2, where the filter is a capacitor, C, and the size of $V_{control}$, $\beta$, $\kappa$, and C determine frequency operation, $\phi$, where $\phi \sim (1-\kappa)(V_{control}-V_T)^2 A_d \beta/(2 V_{swing} C)$, circuit constant $A_d$ is differential gain of amplifier A, $V_{swing}$ is magnitude of oscillator circuit output signal swing, and $V_T$ is threshold voltage of the first current control transistor.

* * * * *

UNITED STATES PATENT AND TRADEMARK OFFICE
CERTIFICATE OF CORRECTION

PATENT NO. : 7,994,869 B2
APPLICATION NO. : 12/430760
DATED : August 9, 2011
INVENTOR(S) : Jed Griffin and Miguel Gamarra Page 1 of 1

It is certified that error appears in the above-identified patent and that said Letters Patent is hereby corrected as shown below:

In the Specification:

Column 2, Line 19: delete "M1" and insert --M11--.

In the Claims:

Column 4, Line 2: after "coupled", insert --to--.

Column 4, Line 20: after "coupled", insert --to--.

Signed and Sealed this
Third Day of December, 2013

Margaret A. Focarino
*Commissioner for Patents of the United States Patent and Trademark Office*